(12) United States Patent  (10) Patent No.: US 11,626,530 B2
Hong et al.  (45) Date of Patent: Apr. 11, 2023

(54) METHOD OF TRANSFERRING MICRO-LIGHT EMITTING DIODES

(71) Applicant: SAMSUNG ELECTRONICS CO., LTD., Suwon-si (KR)

(72) Inventors: Seogwoo Hong, Yongin-si (KR); Junsik Hwang, Hwaseong-si (KR); Hyunjoon Kim, Seoul (KR); Joonyong Park, Suwon-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 160 days.

(21) Appl. No.: 17/171,636

(22) Filed: Feb. 9, 2021

(65) Prior Publication Data
US 2022/0029046 A1   Jan. 27, 2022

(30) Foreign Application Priority Data
Jul. 27, 2020   (KR) .................. 10-2020-0093034

(51) Int. Cl.
*H01L 33/00* (2010.01)
*H01L 25/075* (2006.01)

(52) U.S. Cl.
CPC ........ *H01L 33/005* (2013.01); *H01L 25/0753* (2013.01)

(58) Field of Classification Search
CPC combination set(s) only.
See application file for complete search history.

(56) References Cited

U.S. PATENT DOCUMENTS

| | | | |
|---|---|---|---|
| 9,647,029 B2 | 5/2017 | Lo et al. | |
| 9,722,145 B2 | 8/2017 | Sasaki et al. | |
| 2016/0380158 A1 | 12/2016 | Sasaki et al. | |
| 2019/0296184 A1 | 9/2019 | Ahmed et al. | |
| 2020/0219863 A1 | 7/2020 | Bibl et al. | |
| 2021/0358793 A1* | 11/2021 | Liao | B23K 26/0006 |
| 2022/0013400 A1 | 1/2022 | Hwang et al. | |
| 2022/0051924 A1 | 2/2022 | Kim et al. | |
| 2022/0115568 A1* | 4/2022 | Lee | H01L 25/0753 |

FOREIGN PATENT DOCUMENTS

| | | |
|---|---|---|
| CN | 110047785 A | 7/2019 |
| JP | 4450067 B2 | 4/2010 |
| JP | 6159477 B2 | 7/2017 |
| KR | 10-1961834 B1 | 3/2019 |
| KR | 10-2019-0091923 A | 8/2019 |
| KR | 10-2020-0026285 A | 3/2020 |

* cited by examiner

*Primary Examiner* — Ratisha Mehta

(57) ABSTRACT

A method of transferring micro-light emitting diodes is provided. The method includes preparing a transfer substrate including a first groove, a second groove, and a third groove; forming a first transfer prevention film on the second groove and forming a second transfer prevention film on the third groove; transferring, into the first groove, a first micro-light emitting diode configured to emit a first color light; removing the first transfer prevention film formed on the second groove; transferring, into the second groove, a second micro-light emitting diode configured to emit a second color light; removing the second transfer prevention film formed on the third groove; and transferring, into the third groove, a third micro-light emitting diode configured to emit a third color light.

15 Claims, 13 Drawing Sheets

METHOD OF TRANSFERRING MICRO-LIGHT EMITTING DIODES

CROSS-REFERENCE TO RELATED APPLICATION

This application is based on and claims priority under 35 U.S.C. § 119 to Korean Patent Application No. 10-2020-0093034, filed on Jul. 27, 2020, in the Korean Intellectual Property Office, the disclosure of which is incorporated by reference herein in its entirety.

BACKGROUND

1. Field

The present disclosure relates to a method of transferring micro-light emitting diodes that emit a plurality of color lights.

2. Description of Related Art

Light emitting diodes (LEDs) are advantageous in view of their low power consumption and environmental friendliness. Due to these advantages, the industrial demand for display devices, lighting devices, LCD backlights, etc., which employ LEDs has increased. Recently, display devices using microscopic light emitting diodes have been developed. In manufacturing a micro-light emitting diode display device, it is necessary to transfer micro-light emitting diodes to a substrate. A pick-and-place method has been widely used for transferring micro-light emitting diodes. However, such a method has low productivity when the size of a micro-light emitting diode is decreased and the size of a display is increased. Moreover, for transferring micro-light emitting diodes that emit a plurality of color lights, a transferring process needs to be repeated as many times as the number of colors, and thus, it takes a lot of time for such transferring.

SUMMARY

One or more example embodiments provide a method of transferring micro-light emitting diodes that emit a plurality of color lights.

Additional aspects will be set forth in part in the description which follows and, in part, will be apparent from the description, or may be learned by practice of the presented embodiments of the disclosure.

According to an aspect of an example embodiment, there is provided a method of transferring micro-light emitting diodes, the method including: preparing a transfer substrate including a first groove, a second groove, and a third groove; forming a first transfer prevention film on the second groove and forming a second transfer prevention film on the third groove; transferring, into the first groove, a first micro-light emitting diode configured to emit a first color light; removing the first transfer prevention film formed on the second groove; transferring, into the second groove, a second micro-light emitting diode configured to emit a second color light; removing the second transfer prevention film formed on the third groove; and transferring, into the third groove, a third micro-light emitting diode configured to emit a third color light.

The first transfer prevention film may be removable by an organic solution, and the second transfer prevention film is removable by an alkali solution.

The first transfer prevention film has a first pattern may have a first volume, and the second transfer prevention film may have a second pattern having a second volume that is greater than the first volume.

The first transfer prevention film and the second transfer prevention film may have a same height.

After the removing of the first transfer prevention film, the second transfer prevention film may remain on the third groove and have a third volume that is less than or equal to a difference between the first volume and the second volume.

The first transfer prevention film may have a dot pattern, a stripe pattern, a lattice pattern, or a concentric pattern, and the second transfer prevention film may include a thin film that fills the third groove.

The first transfer prevention film and the second transfer prevention film may include a same material, and the method further may include selectively removing the first transfer prevention film formed on the second groove using a mask that exposes the first transfer prevention film and blocks the second transfer prevention film.

The first transfer prevention film and the second transfer prevention film may have thicknesses equal to depths of the second groove and the third groove, respectively.

The first transfer prevention film and the second transfer prevention film may include a hydrophobic thin film.

The method may further include selectively removing the first transfer prevention film formed on the second groove using a mask that exposes the first transfer prevention film and blocks the second transfer prevention film.

The hydrophobic thin film may have a thickness that is less than depths of the second groove and the third groove.

The transferring of the first micro-light emitting diode, the second micro-light emitting diode, and the third micro-light emitting diode may include supplying a liquid into the first groove, the second groove, and the third groove, supplying a corresponding micro-light emitting diode, among the first micro-light emitting diode, the second micro-light emitting diode, and the third micro-light emitting diode, on to the transfer substrate, and scanning the transfer substrate with an absorbent that absorbs the liquid.

The supplying of the liquid may include at least one of a spraying method, a dispensing method, an inkjet dot method, or a method of flowing the liquid to the transfer substrate.

The liquid may include at least one of water, ethanol, alcohol, polyol, ketone, halocarbon, acetone, flux, or an organic solvent.

The absorbent may include fabric, tissue, polyester fiber, paper or a wiper.

According to an aspect of an example embodiment, there is provided a method of transferring micro-light emitting diodes, the method including: preparing a transfer substrate including a first groove, a second groove, and a third groove; forming transfer induction films on the first groove, the second groove, and the third groove, the transfer induction films including a hydrophilic thin film; forming a transfer prevention film on the transfer induction films formed on the second groove and the third groove, the transfer prevention film including a hydrophobic thin film; transferring, into the first groove, a first micro-light emitting diode configured to emit a first color light, by using the transfer induction film formed on the first groove; removing a first section of the transfer prevention film formed on the second groove; transferring, into the second groove, a second micro-light emitting diode configured to emit a second color light, by using the transfer induction film formed on the second groove; removing a second section of the transfer prevention film formed on the third groove; and transferring, into the third groove, a third micro-light emitting diode configured to emit a third color light, by using the transfer induction film formed on the third groove.

In the forming of the transfer prevention film, a mask that blocks the first groove and exposes the second groove and the third groove may be used.

The transferring of the first micro-light emitting diode, the second micro-light emitting diode, and the third micro-light emitting diode may include supplying a liquid into the first groove, the second groove, and the third groove, supplying a corresponding micro-light emitting diode, among the first micro-light emitting diode, the second micro-light emitting diode, and the third micro-light emitting diode, on to the transfer substrate, and scanning the transfer substrate with an absorbent that absorbs the liquid.

The supplying of the liquid may include at least one of a spraying method, a dispensing method, an inkjet dot method, or a method of flowing the liquid to the transfer substrate.

The liquid may include at least one of water, ethanol, alcohol, polyol, ketone, halocarbon, acetone, flux, or an organic solvent.

The absorbent may include fabric, tissue, polyester fiber, paper or a wiper.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
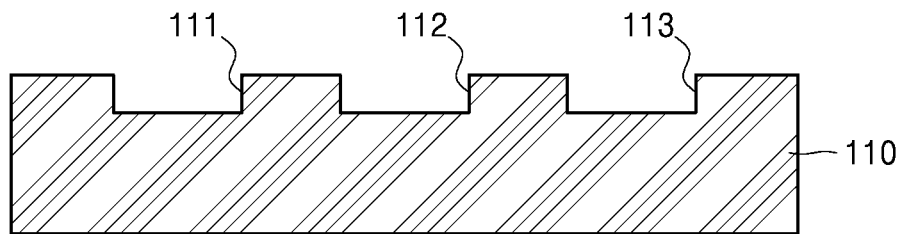
FIGS. 1 to 7 are diagrams for explaining a method of transferring micro-light emitting diodes according to an example embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, the method of transferring micro-light emitting diodes according to various example embodiments will be described in detail with reference to the accompanying drawings. In the following drawings, like reference numerals denote like components, and the size of each component may be exaggerated for clarity and convenience of description. Terms such as "first" and "second" may be used to describe various components, but the components should not be limited to the terms. The terms are used only to distinguish one component from other components.

An expression of the singular number includes an expression of the plural number, so long as it is clearly read differently. In addition, when a part is referred to as "including" a component, other components may be further included, not excluded, unless there is any other particular mention on it. In addition, in the drawings, the size or thickness of each component may be exaggerated for clarity and convenience of description. When it is described that a certain material layer is on a substrate or another layer, the material layer may be directly on the substrate or another layer, or a third layer may be interposed therebetween. In addition, a material forming each layer in the embodiments below are only illustrative, and thus, a material other than the illustrated material may be used.

In addition, the terms "-er", "-or", "unit" and "module" described in the specification mean units for processing at least one function and operation and may be implemented by hardware components or software components and combinations thereof.

The particular implementations described herein are examples and are not intended to otherwise limit the technical scope of the disclosure in any way. For the simplicity of the specification, conventional electronic configurations, control systems, software, and descriptions of other functional aspects of the systems may be omitted. Furthermore, the connecting lines or connectors shown in the drawings are intended to represent examples of functional relationships, physical connections, and logical connections between the various components, and alternative or additional functional relationships, physical connections, and logical connections may be present in a practical device.

The use of "the" and other demonstratives similar thereto may correspond to both a singular form and a plural form.

Unless the order of operations of a method is explicitly mentioned, the operations may be performed in a proper order. The use of all exemplary terms (for example, "and so forth") is merely intended to describe the technical spirit of the disclosure in detail, and the scope of the disclosure is not limited by the terms unless defined by the claims.

FIGS. 1 to 7 are diagrams for explaining a method of transferring micro-light emitting diodes according to an example embodiment.

Referring to FIG. 1, a transfer substrate 110 including a plurality of grooves may be prepared. The transfer substrate 110 may be provided as a single layer or may include a plurality of layers. The plurality of grooves may be provided to accommodate at least one micro-light emitting diode therein.

FIG. 1 illustrates a region corresponding to one pixel. The pixel may include a plurality of sub-pixels. The pixel may be a base unit for displaying a color in a display apparatus. For example, one pixel may emit a first color light, a second color light, and a third color light, and a color may be displayed by the first through third color lights. For example, the first color light may include a red light, the second color light may include a green light, and the third color light may include a blue light. However, the color light is not limited thereto. The pixel may include a plurality of sub-pixels, each of which emits a respective color light. For example, the pixel may include a first sub-pixel that emits a first color light, a second sub-pixel that emits a second color light, and a third sub-pixel that emits a third color light. The first sub-pixel, the second sub-pixel, and the third sub-pixel may be electrically and independently operated, respectively.

For example, a first groove 111, a second groove 112, and a third groove 113 may be provided on the transfer substrate 110. The transfer substrate 110 of FIG. 1 may correspond to the pixel, the first groove 111 may correspond to the first sub-pixel, the second groove 112 may correspond to the second sub-pixel, and the third groove 113 may correspond to the third sub-pixel.

Figure 2:
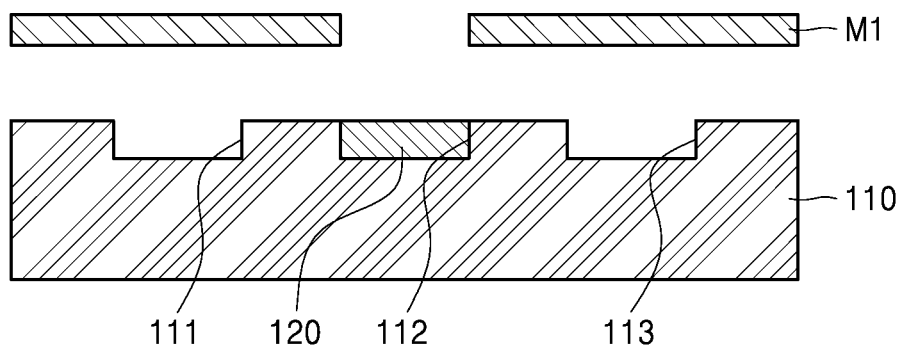
Figure 3:
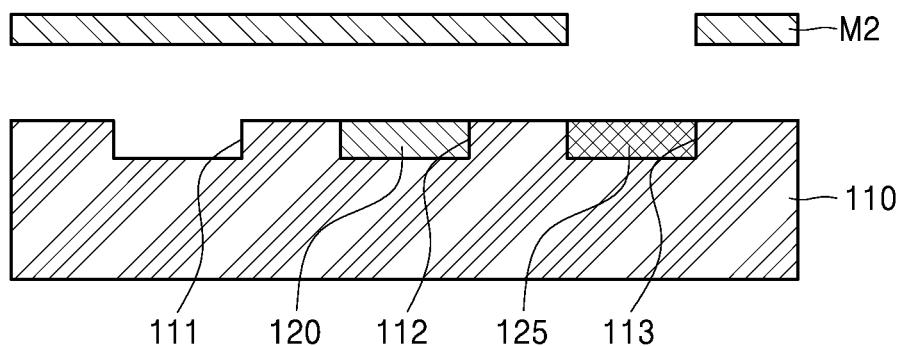

Referring to FIG. 2, a first transfer prevention film 120 may be formed on the second groove 112 by using a first mask M1. The first mask M1 may expose the second groove 112 and may block the first groove 111 and the third groove 113. Referring to FIG. 3, a second transfer prevention film 125 may be formed on the third groove 113 by using a second mask M2. The second mask M2 may expose the third groove 113 and may block the first groove 111 and the second groove 112.

The first transfer prevention film 120 and the second transfer prevention film 125 may include a selectively removable material. For example, the first transfer prevention film 120 may include a material that is removable by an organic solution, and the second transfer prevention film 125 may include a material that is removable by an alkaline solution. The first transfer prevention film 120 may include, for example, a photoresist. The organic solution may include, for example, acetone. The second transfer prevention film 125 may include, for example, Al or photoresist/Al. The alkaline solution may include, for example, KOH or tetramethyl ammonium hydroxide (TMAH).

Accordingly, the first transfer prevention film 120 and the second transfer prevention film 125 may be selectively removed according to the solution applied therein.

Figure 4:
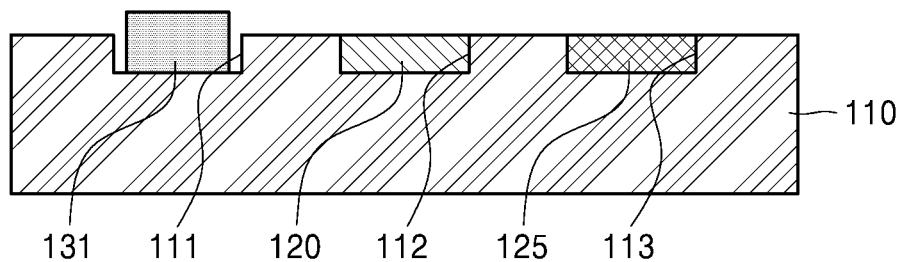

Referring to FIG. 4, a first micro-light emitting diode 131 that emits a first color light may be transferred into the first groove 111. The second groove 112 and the third groove 113 may be blocked by the first transfer prevention film 120 and the second transfer prevention film 125, respectively, and thus the first micro-light emitting diode 131 may be automatically transferred into the first groove 111.

Figure 5:
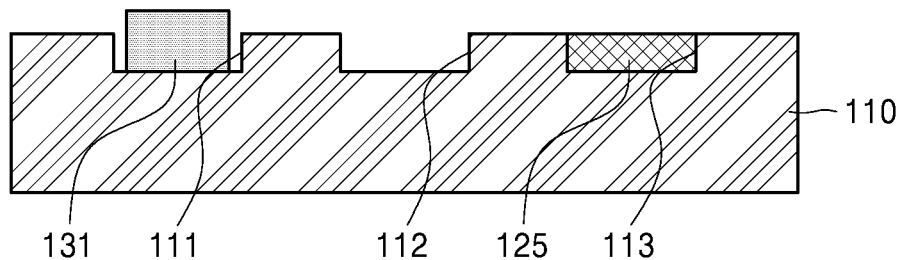

Referring to FIG. 5, the first transfer prevention film 120 may be removed using, for example, an organic solution. The second transfer prevention film 125 may be formed of the material that does not react with the organic solution, and thus, only the first transfer prevention film 120 may be selectively removed using the organic solution. The second groove 112 may be exposed by removing the first transfer prevention film 120.

Figure 6:
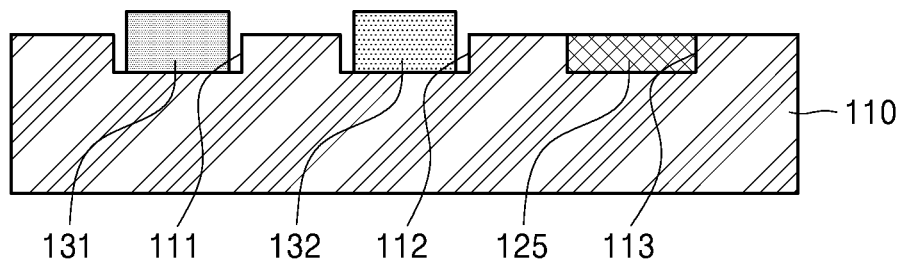

Referring to FIG. 6, a second micro-light emitting diode 132 that emits a second color light may be transferred into the second groove 112. The first micro-light emitting diode 131 may be transferred into the first groove 111 and the third groove 113 may be blocked by the second transfer prevention film 125, and thus the second micro-light emitting diode 132 may be transferred into the second groove 112.

Then, the second transfer prevention film 125 may be removed using the alkaline solution. The third groove 113 may be exposed by removing the second transfer prevention film 125.

Figure 7:
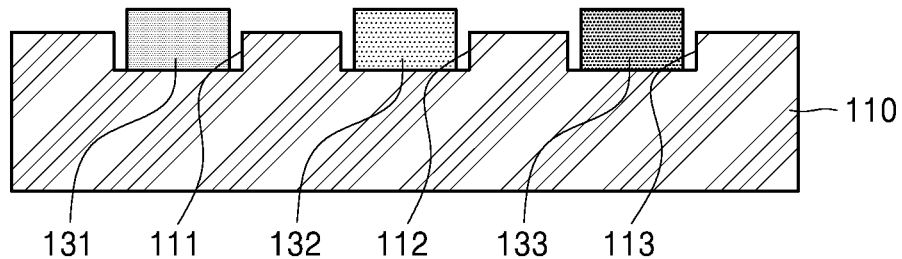

Referring to FIG. 7, a third micro-light emitting diode 133 that emits a third color light may be transferred into the exposed third groove 113.

As described above, a method of manufacturing a micro-light emitting diode display device according to an example embodiment may easily transfer micro-light emitting diodes that emit different color lights by selectively removing the transfer prevention films, each of which are formed of heterogeneous materials, and may sequentially transfer the micro-light emitting diodes of the different colors to a single transfer substrate without any limitations on the shape, size, or the like of the micro-light emitting diodes.

The first, second, and third micro-light emitting diodes 111, 112, and 113 may be transferred by using a dry transfer method or a wet transfer method.

Figure 8:
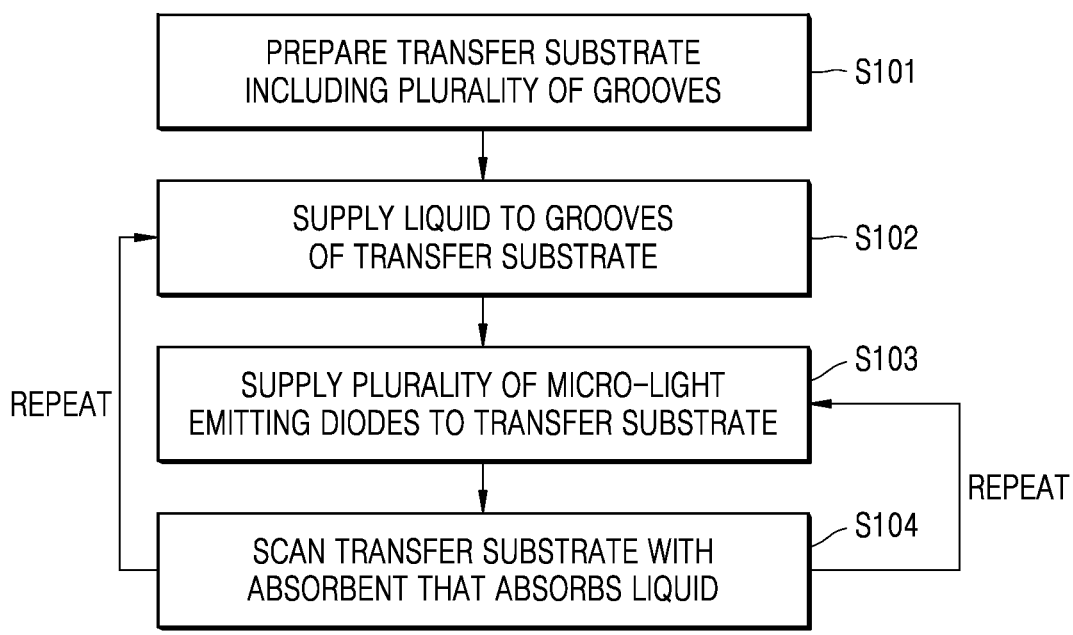
FIG. 8 illustrates a wet transfer method according to an example embodiment.

FIG. 8 illustrates an example of the wet transfer method according to an example embodiment.

The wet transfer method may include preparing a transfer substrate including a plurality of grooves (S101), supplying a liquid to the grooves of the transfer substrate (S102), supplying a plurality of micro-light emitting diodes to the transfer substrate (S103), and absorbing the liquid by scanning the transfer substrate with an absorbent that may absorb the liquid (S104). For example, operations S102, S103, and S104 may be sequentially performed with respect to the first micro-light emitting diode 131, the second micro-light emitting diode 132, and the third micro-light emitting diode 133.

The supplying of the liquid may include, for example, at least one of a spray method, a dispensing method, an inkjet dot method, or a method of flowing the liquid to the transfer substrate. The liquid may include, for example, at least one of the group consisting of water, ethanol, alcohol, polyol, ketone, halocarbon, acetone, flux, or an organic solvent. The scanning of the transfer substrate 110 with the absorbent may include sliding the transfer substrate 110 with the absorbent.

Various methods may be used for supplying the liquid to the first, second, and third grooves 111, 112, and 113. For example, a spray method, a dispensing method, an inkjet dot method and a method of flowing the liquid to the transfer substrate 110 may be used.

The first, second, and third micro-light emitting diodes 131, 132, and 133 may be sequentially scattered on the transfer substrate 110 without a liquid or may be supplied using a material other than a liquid. Alternatively, the first, second, and third micro-light emitting diodes 131, 132, and 133 may be supplied to the transfer substrate 110 in a state in which they are included in a suspension, by various methods. In this case, the supplying of the micro-light emitting diodes may be performed by various methods such as a spray method, a dispensing method, an inkjet dot method, or a method of flowing a suspension to the transfer substrate 110. However, a method of supplying the micro-light emitting diodes to the transfer substrate 110 is not limited thereto and may be modified in various ways. The liquid may be supplied to fit the grooves 111, 112, and 113, or may be supplied to overflow the grooves 111, 112, and 113. An amount of the liquid supplied may be variously adjusted.

The absorbent that may absorb the liquid may be any material that may absorb the liquid, and the shape or structure thereof is not limited. The absorbent may include, for example, fabric, tissue, polyester fiber, paper, or a wiper.

The absorbent may be used alone without other auxiliary devices, or may be used together with the auxiliary devices as necessary.

According to an example embodiment, the first, second, and third micro-light emitting diodes 131, 132, and 133 may be arranged in the corresponding first, second, and third grooves 111, 112, and 113, respectively. The micro-light emitting diodes 131, 132, and 133 may be irregularly arranged on each groove. The first, second, and third grooves 111, 112, and 113 may have sizes greater than those of the first, second, and third micro-light emitting diodes 131, 132, and 133, respectively. The number of the micro-light emitting diodes transferred into each groove may vary according to the size of the groove.

The first, second, and third micro-light emitting diodes 131, 132, and 133 may have a size of, for example, 200 μm or less. Here, the size may be a maximum diameter of a cross-section of the micro-light emitting diode. The cross-section may be perpendicular to a direction in which light from the micro-light emitting diode is emitted. The micro-light emitting diode may have various shapes such as a triangular cross-section, a rectangular cross-section, a circular cross-section, and so forth. The size of the groove may be determined according to, for example, a desired number of micro-light emitting diodes. The groove may have various shapes, for example, a triangular cross-section, a rectangular cross-section, a circular cross-section, and so forth.

Figure 9:
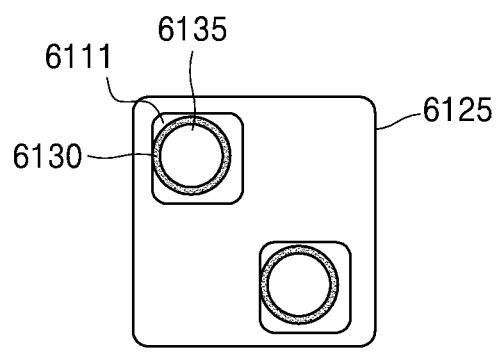
FIGS. 9 to 11 are diagrams of various examples of grooves and micro-light emitting diodes transferred into each groove in a region corresponding to each sub-pixel according to an example embodiment.
Figure 10:
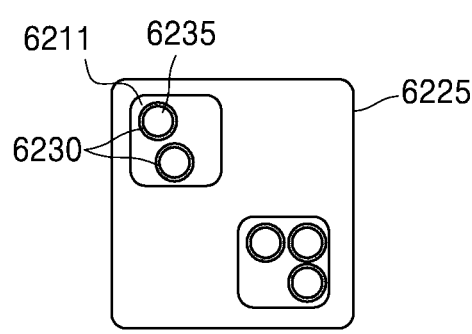
Figure 11:
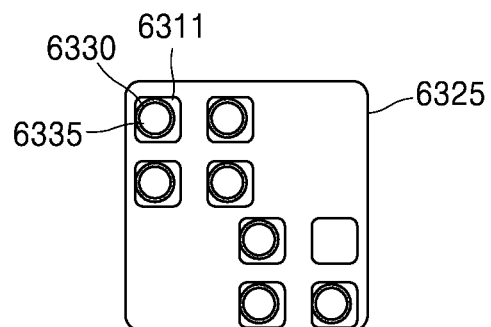

FIGS. 9 to 11 are diagrams of various examples of grooves and micro-light emitting diodes transferred into each groove in a region corresponding to each sub-pixel.

Referring to FIG. 9, two grooves 6111 may be formed in a transfer substrate 6125 of a sub-pixel region, and a micro-light emitting diode 6130 may be formed on each of the two grooves 6111. In the micro-light emitting diode 6130, an electrode pad 6135 may be on an upper surface of the micro-light emitting diode 6130 toward an opening of the groove 6111. The two grooves 6111 may be arranged in a diagonal direction on the transfer substrate 6125. In the case where the two grooves 6111 are arranged in a diagonal direction, a possibility that the micro-light emitting diode 6130 is omitted in transferring the micro-light emitting diode 6130 may be decreased, as compared to the case where the two grooves 6111 are arranged in a straight line.

Referring to FIG. 10, two grooves 6211 may be formed in a transfer substrate 6225 of a sub-pixel region, and a plurality of micro-light emitting diodes 6230 may be formed on each of the two grooves 6211. The groove 6211 may have a size to accommodate the plurality of micro-light emitting diodes 6230. Reference numeral 6235 denotes an electrode pad. In this case, assuming that, for example, three micro-light emitting diodes 6230 are allocated to the groove 6211, even though some micro-light emitting diodes are omitted from some of the groove 6211, a pixel operation may be properly performed, and thus a pixel defective rate may be decreased and a repair process may be prevented.

Referring to FIG. 11, eight grooves 6311 may be formed in a transfer substrate 6325 of a sub-pixel region, and a micro-light emitting diode 6330 may be formed on each of the eight grooves 6311. An electrode pad 6335 may be on an upper surface of the micro-light emitting diode 6330 toward an opening of the groove 6311.

In the case where the number of grooves in a region corresponding to a sub-pixel is high, or a plurality of micro-light emitting diodes are to be transferred into each groove, even though the micro-light emitting diodes are not transferred into some of the grooves, the pixel operation may be properly performed, and thus a defective rate may be decreased.

Other arrangement structures of the grooves and the micro-light emitting diodes may be implemented.

Examples of the transfer substrate will be described hereafter with reference to FIGS. 12 to 34.

Referring to FIG. 1, the transfer substrate 110 may be formed as a single (monolithic) body. In this case, the transfer substrate 110 may have a single mold structure.

Figure 12:
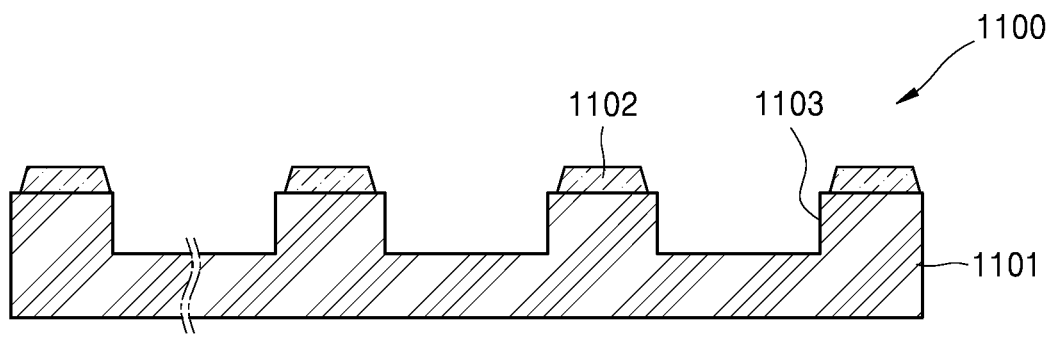
FIGS. 12 to 15 are diagrams of examples of a transfer substrate used in the method of transferring micro-light emitting diodes according to an example embodiment.

Referring to FIG. 12, a transfer substrate 1100 may include a transfer mold 1101 having a plurality of grooves 1103 and a metal layer 1102 on a surface of the transfer mold 1101. The metal layer 1102 may include, for example, at least one of Ag, Au, Pt, Ni, Cr, or Al. When removing a dummy micro-light emitting diode remaining on the transfer substrate 1101, the metal layer 1102 may allow the dummy micro-light emitting diode to be completely separated from the transfer substrate 1101. After all the micro-light emitting diodes are transferred to the transfer substrate 1101, the transfer substrate 1101 may be cleaned. In this case, the metal layer 1102 may allow the dummy micro-light emitting diode remaining on the surface of the transfer substrate 1101 to be effectively separated.

Figure 13:
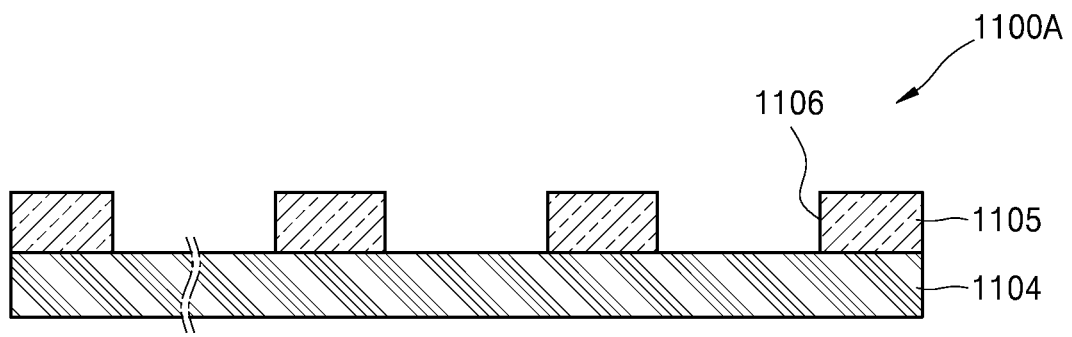

Referring to FIG. 13, a transfer substrate 1100A may include a substrate 1104 and a transfer mold 1105. A plurality of grooves 1106 may be formed on the transfer mold 1105. The groove 1106 may be formed on the transfer mold 1105 to have a shape of a through-hole or a groove.

Figure 14:
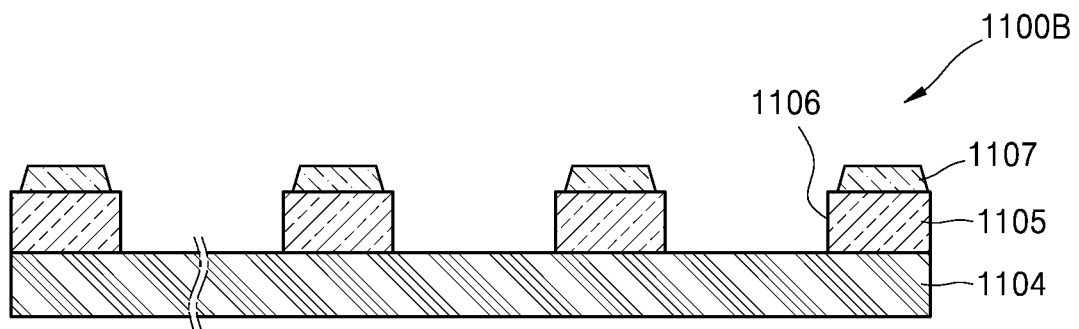

Referring to FIG. 14, a transfer substrate 1100B may include a substrate 1104, a transfer mold 1105, and a metal layer 1107 on a surface of the transfer mold 1105. The metal layer 1107 may include, for example, at least one of Ag, Au, Pt, Cr, or Al.

Figure 15:
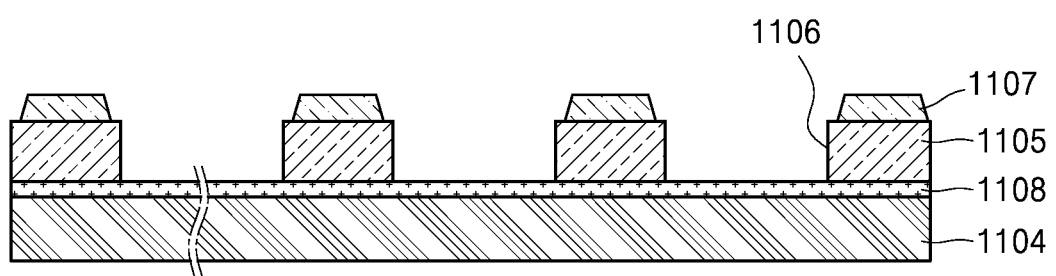

Referring to FIG. 15, the transfer substrate of FIG. 14 may further include an oxide layer 1108 between the substrate 1104 and the transfer mold 1105. The oxide layer 1108 may include, for example, $SiO_2$, $Al_2O_3$, or $NiO_2$. The oxide layer 1108 may have hydrophilicity. The oxide layer 1108 may allow the groove 1106 to filled with liquid.

Hereinafter, a method of transferring micro-light emitting diodes according to another embodiment will be described with reference to FIGS. 16 to 22.

Figure 16:
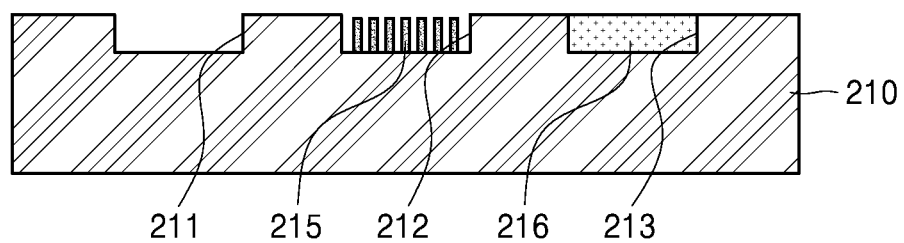
FIGS. 16 to 22 are diagrams for explaining a method of transferring micro-light emitting diodes according to another example embodiment.

Referring to FIG. 16, a transfer substrate 210 including a first groove 211, a second groove 212, and a third groove 213 may be prepared. A first transfer prevention film 215 may be formed on the second groove 212, and a second transfer prevention film 216 may be formed on the third groove 213. For example, the first transfer prevention film 215 may have a pattern having a first volume, and the second transfer prevention film 216 may have a pattern having a second volume. The first volume may be less than the second volume. The first transfer prevention film 215 and the second transfer prevention film 216 may be configured to have different volumes to allow the transfer prevention films to be selectively removed, when removing the transfer prevention films.

The first transfer prevention film 215 and the second transfer prevention film 216 may be formed by a photo process using a photoresist material.

Figure 17:
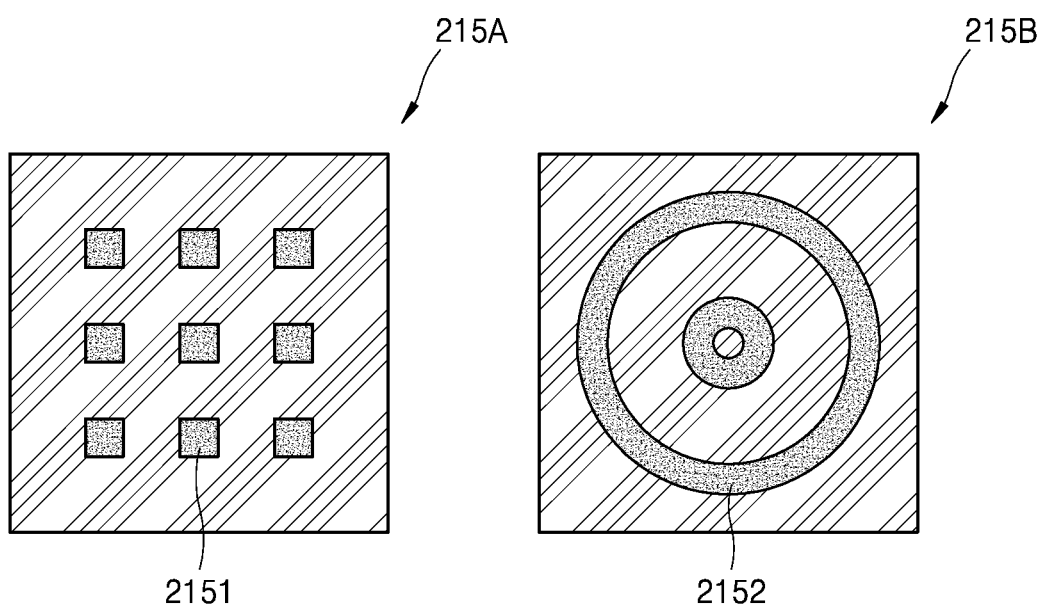

FIG. 17 illustrates examples of the pattern of the first transfer prevention film. A first transfer prevention film 215A may have, for example, a dot pattern 2151 in a plan view. That is, stereoscopically, the first transfer prevention film 215A may have a pattern in which rods are arranged in the groove. Alternatively, a first transfer prevention film 2156 may have, for example, a concentric pattern 2152 in a plan view. The pattern of the first transfer prevention film is not limited thereto, and may have various patterns such as a lattice pattern or a stripe pattern.

The second transfer prevention film 216 may have a pattern or a film shape filled in the third groove 213. Referring to FIG. 16, the first transfer prevention film 215 and the second transfer prevention film 216 may have the same height. In addition, the first transfer prevention film 215 and the second transfer prevention film 216 may be formed of the same material.

Figure 18:
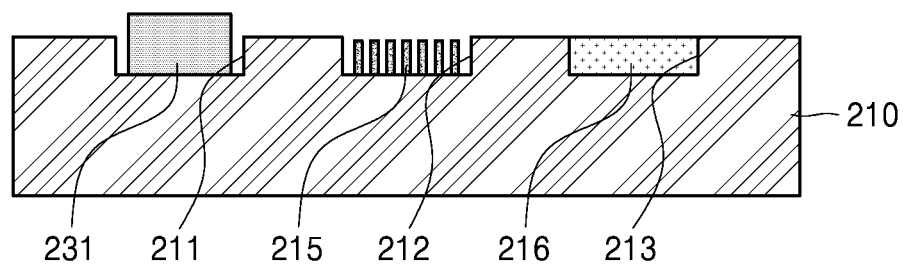

Referring to FIG. 18, a first micro-light emitting diode 231 that emits a first color light may be transferred into the exposed first groove 211. Here, the second groove 212 and the third groove 213 may be blocked, and accordingly the first micro-light emitting diode 231 may not be transferred into the second groove 212 and the third groove 213.

Figure 19:
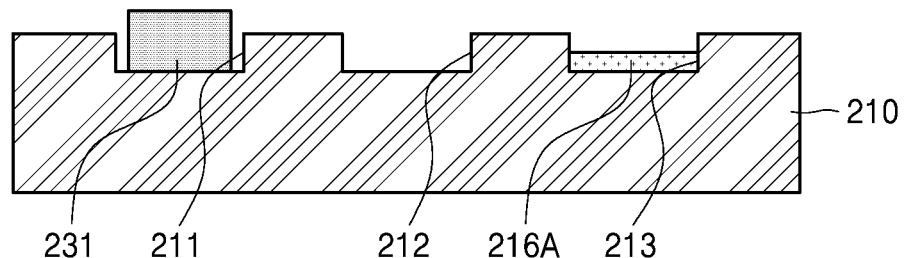

Referring to FIG. 19, the first transfer prevention film 215 and the second transfer prevention film 216 may be removed. The first transfer prevention film 215 and the second transfer prevention film 216 may have a difference between their volumes, and thus while the first transfer prevention film 215 may be completely removed, the second transfer prevention film may remain as much as the difference between the first volume and the second volume. A remaining second transfer prevention film 216A may partially fill the third groove 213. The first transfer prevention film 215 and the second transfer prevention film 216 may be removed by, for example, an ashing process using a photoresist.

Figure 20:
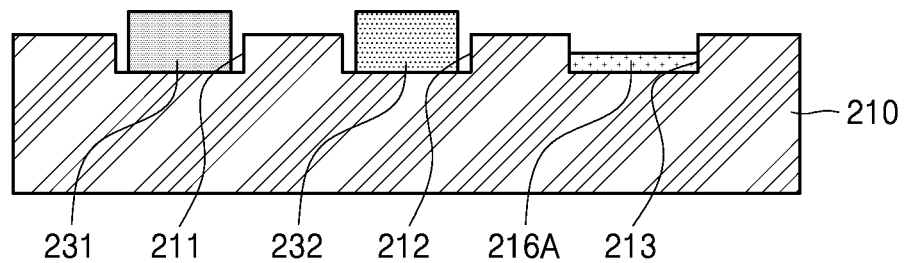
Figure 21:
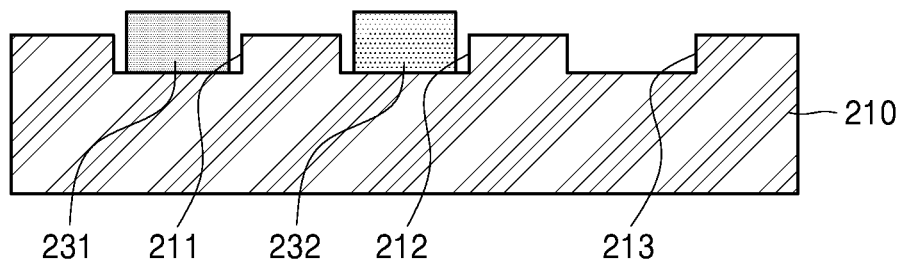
Figure 22:
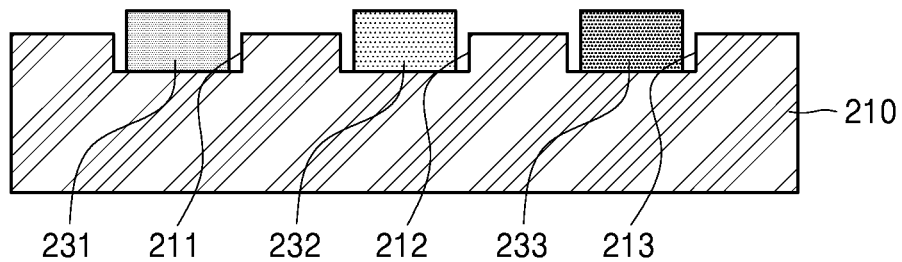

Referring to FIG. 20, a second micro-light emitting diode 232 that emits a second color light may be transferred into the second groove 212. The third groove 213 may be blocked by the remaining second transfer prevention film 216A, and thus the second micro-light emitting diode 232 may be prevented from being transferred into the third groove 213. Then, as shown in FIG. 21, the third groove 213 may be exposed by removing the remaining second transfer prevention film 216A. Referring to FIG. 22, the third micro-light emitting diode 233 that emits a third color light may be transferred into the exposed third groove 213.

In the example embodiment, a dry transfer method or a wet transfer method may be used as the transfer method. In the present embodiment, the first transfer prevention film and the second transfer prevention film may be formed of the same material, and the first transfer prevention film and the second transfer prevention film may be selectively removed by using a volume difference. The structures of the transfer substrate, the micro-light emitting diodes and the grooves, the wet transfer method, and so forth described with reference to FIGS. 1 to 15 may be applied in the same manner.

Hereinafter, a method of manufacturing a micro-light emitting diode display according to another example embodiment will be described with reference to FIGS. 23 to 26.

Figure 23:
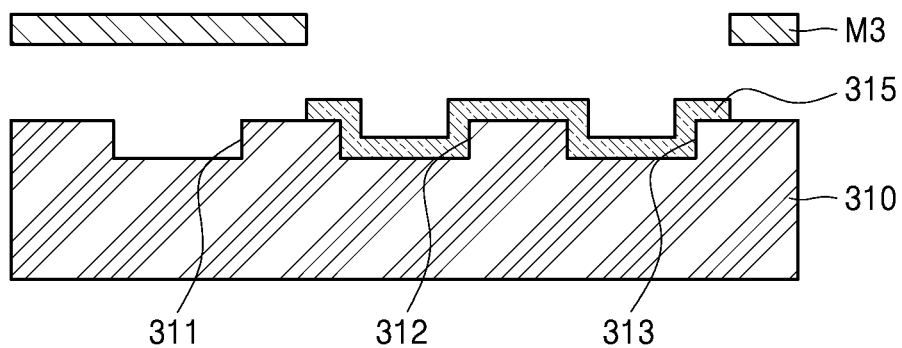
FIGS. 23 to 26 are diagrams for explaining a method of transferring micro-light emitting diodes according to another example embodiment.

Referring to FIG. 23, a transfer substrate 310 including a first groove 311, a second groove 312, and a third groove 313 may be prepared. Transfer prevention film 315 may be formed on the second groove 312 and the third groove 313 using a third mask M3 that blocks the first groove 311 and exposes the second groove 312 and the third groove 313. The transfer prevention film 315 may include the same material. For example, the transfer prevention film 315 may have thicknesses equal to depths of the second groove 312 and the third groove 313.

Figure 24:
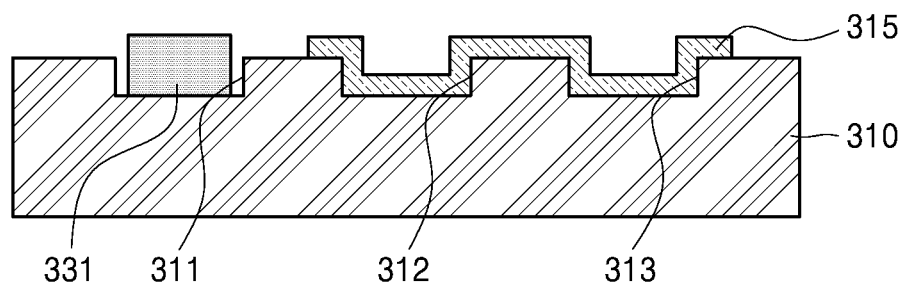
Figure 25:
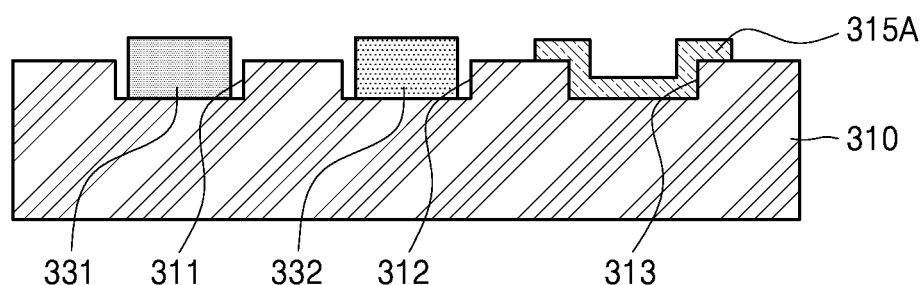

Referring to FIG. 24, a first micro-light emitting diode 331 that emits a first color light may be transferred into the first groove 311. Then, referring to FIG. 25, the transfer prevention film 315 on the second groove 312 may be removed using a mask that exposes the transfer prevention film 315 on the second groove 312 and blocks the transfer prevention film 315 on the third groove 313, and thus the transfer prevention film 315 may remain only on the third groove 313. The remaining transfer prevention film 315A may block the third groove 313. Accordingly, a second micro-light emitting diode 332 that emits a second color light may be transferred into the second groove 312.

Figure 26:
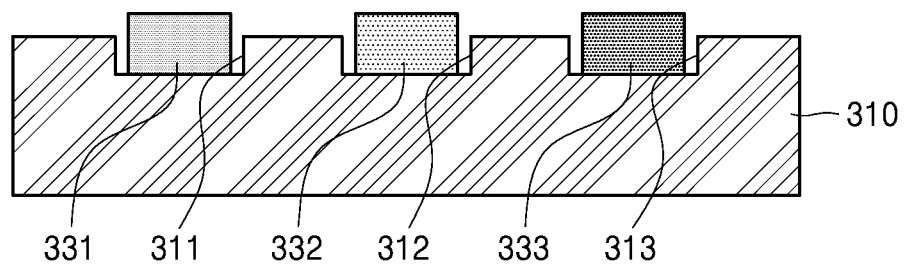

Referring to FIG. 26, the remaining transfer prevention film 315A may be removed, and a third micro-light emitting diode 333 that emits a third color light may be transferred into the exposed third groove 313.

Hereinafter, a method of transferring micro-light emitting diodes according to another example embodiment will be described with reference to FIGS. 27 to 30.

Figure 27:
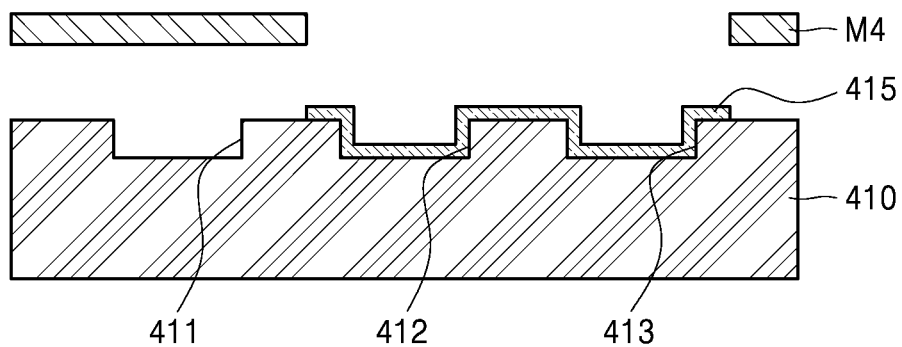
FIGS. 27 to 30 are diagrams for explaining a method of transferring micro-light emitting diodes according to another example embodiment.

Referring to FIG. 27, a transfer substrate 410 including a first groove 411, a second groove 412, and a third groove 413 may be prepared. Transfer prevention films 415 may be formed on the second groove 412 and the third groove 413 using a fourth mask M4 that blocks the first groove 411 and exposes the second groove 412 and the third groove 413. The transfer prevention films 415 may include the same material. The transfer prevention films 415 may include, for example, a hydrophobic thin film. The transfer prevention films 415 may have, for example, physical properties that interrupt the transfer of micro-light emitting diodes. The transfer prevention films 415 may have thicknesses less than depths of the second groove 412 and the third groove 413.

Figure 28:
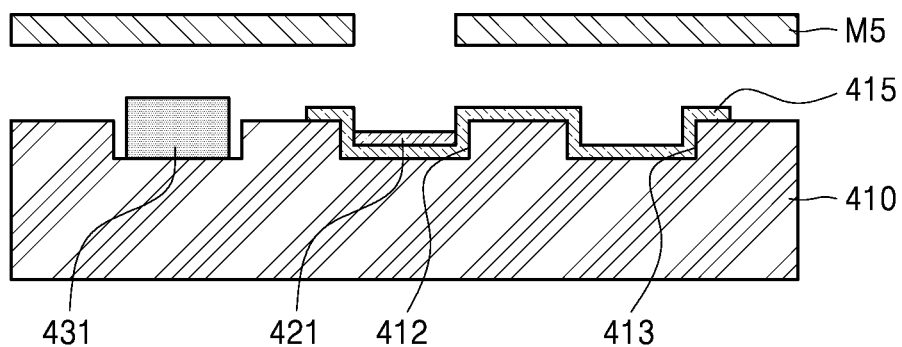

Referring to FIG. 28, a first micro-light emitting diode 431 that emits a first color light may be transferred into the first groove 411. Then, a first transfer induction film 421 may be formed on the second groove 412 using a fifth mask M5 that exposes a region on which the second groove 412 is formed and blocks a region on which the first groove 411 and the third groove 413 are formed. The first transfer induction film 421 may include, for example, a hydrophilic thin film. The first transfer induction film 421 may have, for example, physical properties that induce the transfer of micro-light emitting diodes.

Figure 29:
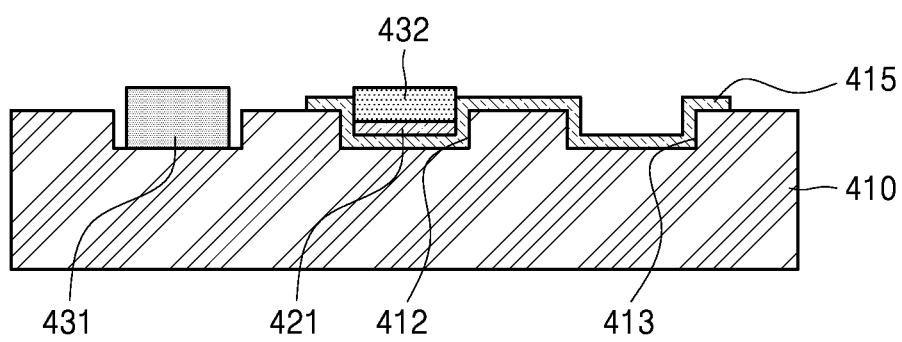

Referring to FIG. 29, a second micro-light emitting diode 432 that emits a second color light may be transferred using the first transfer induction film 421. The transfer prevention film 415 may be formed on the third groove 413, and thus the second micro-light emitting diode 432 may be prevented from being transferred into the third groove 413.

Figure 30:
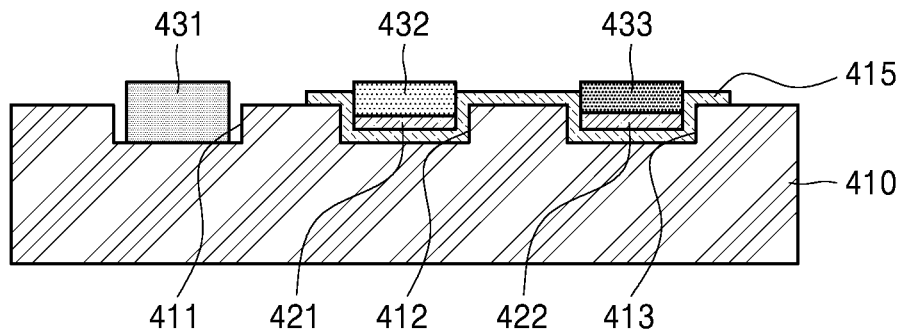

Referring to FIG. 30, a second transfer induction film 422 may be formed on the transfer prevention film 415 on the third groove 413, and a third micro-light emitting diode 433 that emits a third color light may be transferred into the third groove 413.

In the example embodiment, a process of removing the transfer prevention films and the transfer induction films may not be necessary. In addition, in the example embodiment, the first, second, and third micro-light emitting diodes 431, 432, and 433 may have different heights, and thus the overall height may be balanced upon the completion of transfer. Meanwhile, when bonding the micro-light emitting diodes to the driving circuit board after transferring the micro-light emitting diodes, thickness differences between the micro-light emitting diodes may be corrected through a planarization process.

Hereinafter, a method of transferring micro-light emitting diodes according to another example embodiment will be described with reference to FIGS. 31 to 34.

Figure 31:
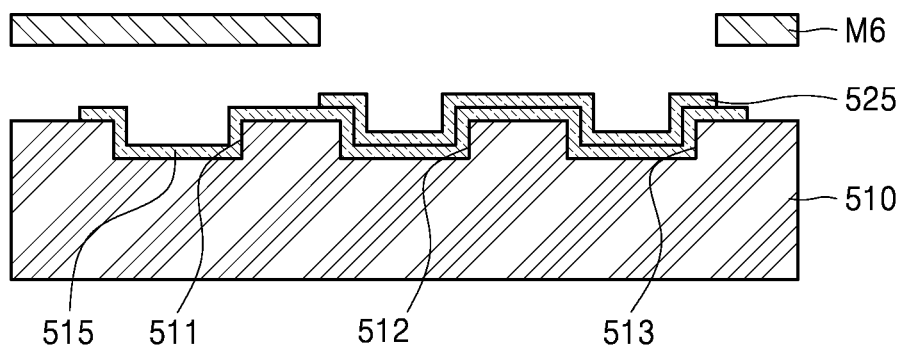
FIGS. 31 to 34 are diagrams for explaining a method of transferring micro-light emitting diodes according to another example embodiment.

Referring to FIG. 31, a transfer substrate 510 including a first groove 511, a second groove 512, and a third groove

513 may be prepared. A transfer induction film 515 may be formed on the first groove 511, the second groove 512, and the third groove 513. The transfer induction film 515 may include, for example, a hydrophilic thin film. Then, a transfer prevention film 525 may be formed on the second groove 512 and the third groove 513 using a sixth mask M6 that blocks the first groove 511 and exposes the second groove 512 and the third groove 513. The transfer prevention film 525 may include, for example, a hydrophobic thin film.

Figure 32:
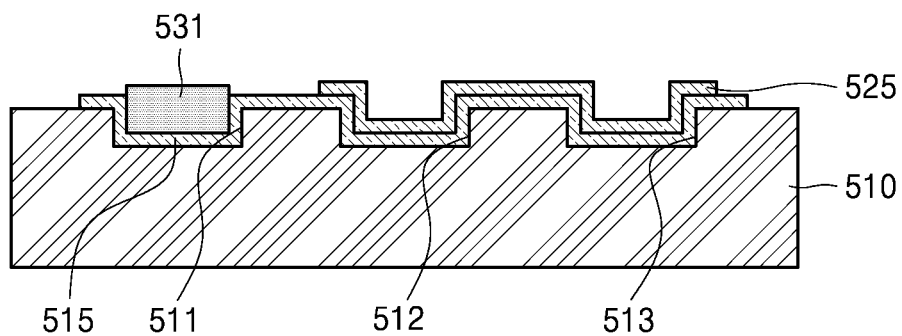

Referring to FIG. 32, a first micro-light emitting diode 531 that emits a first color light may be transferred into the first groove 511. The transfer prevention film 525 may be formed on the second groove 512 and the third groove 513, and thus the first micro-light emitting diode 531 may be prevented from being transferred into the second groove 512 and the third groove 513.

Figure 33:
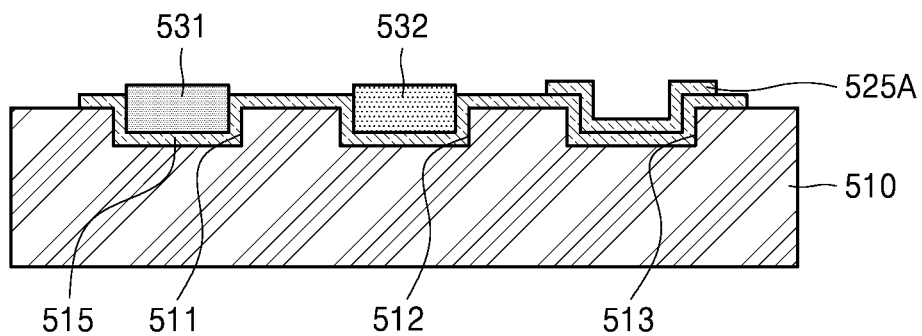

Referring to FIG. 33, the transfer prevention film 525 on the second groove 512 may be removed using a mask, and the transfer prevention film 525A may remain only on the third groove 513. A second micro-light emitting diode 532 that emits a second color light may be transferred into the second groove 512. The second micro-light emitting diode 532 may be prevented from being transferred into the third groove 513 by the transfer prevention film 525A.

Figure 34:
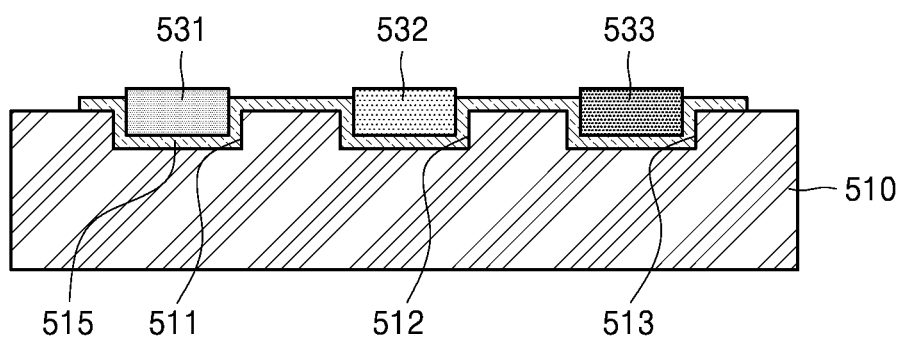

Referring to FIG. 34, the transfer prevention film 525A may be removed, and a third micro-light emitting diode 533 that emits a third color light may be transferred into the third groove 513.

In the method of transferring micro-light emitting diodes according to an example embodiment, it is not necessary to separately manufacture the micro-light emitting diodes in different shapes or sizes according to colors, and the method facilitates transfer of the micro-light emitting diodes with different colors to a single transfer substrate.

The method of transferring micro-light emitting diodes according to an example embodiment may be applied to manufacture various display devices such as a micro-light emitting diode TV, a liquid crystal display device, a mobile device, a display device for a vehicle, AR glasses, VR glasses, a rollable TV, or a stretchable display.

The method of transferring micro-light emitting diodes according to an example embodiment may rapidly and efficiently transfer micro-light emitting diodes that emit different color lights. The method of transferring micro-light emitting diodes according to an example embodiment may transfer micro-light emitting diodes for each color to a large area substrate in a simple manner.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of transferring micro-light emitting diodes, the method comprising:
   preparing a transfer substrate comprising a first groove, a second groove, and a third groove;
   forming a first transfer prevention film on the second groove and forming a second transfer prevention film on the third groove;
   transferring, into the first groove, a first micro-light emitting diode configured to emit a first color light;
   removing the first transfer prevention film formed on the second groove;
   transferring, into the second groove, a second micro-light emitting diode configured to emit a second color light;
   removing the second transfer prevention film formed on the third groove; and
   transferring, into the third groove, a third micro-light emitting diode configured to emit a third color light.

2. The method of claim 1, wherein the first transfer prevention film is removable by an organic solution, and the second transfer prevention film is removable by an alkali solution.

3. The method of claim 1, wherein the first transfer prevention film has a first pattern having a first volume, and the second transfer prevention film has a second pattern having a second volume that is greater than the first volume.

4. The method of claim 3, wherein the first transfer prevention film and the second transfer prevention film have a same height.

5. The method of claim 3, wherein, after the removing of the first transfer prevention film, the second transfer prevention film remains on the third groove and has a third volume that is less than or equal to a difference between the first volume and the second volume.

6. The method of claim 3, wherein the first transfer prevention film has a dot pattern, a stripe pattern, a lattice pattern, or a concentric pattern, and the second transfer prevention film comprises a thin film that fills the third groove.

7. The method of claim 1, wherein the first transfer prevention film and the second transfer prevention film include a same material, and
   wherein the method further comprises selectively removing the first transfer prevention film formed on the second groove using a mask that exposes the first transfer prevention film and blocks the second transfer prevention film.

8. The method of claim 7, wherein the first transfer prevention film and the second transfer prevention film have thicknesses equal to depths of the second groove and the third groove, respectively.

9. The method of claim 1, wherein the first transfer prevention film and the second transfer prevention film include a hydrophobic thin film.

10. The method of claim 9, further comprising selectively removing the first transfer prevention film formed on the second groove using a mask that exposes the first transfer prevention film and blocks the second transfer prevention film.

11. The method of claim 9, wherein the hydrophobic thin film has a thickness that is less than depths of the second groove and the third groove.

12. The method of claim 1, wherein the transferring of the first micro-light emitting diode, the second micro-light emitting diode, and the third micro-light emitting diode comprises supplying a liquid into the first groove, the second groove, and the third groove, supplying a corresponding micro-light emitting diode, among the first micro-light emitting diode, the second micro-light emitting diode, and the third micro-light emitting diode, on to the transfer substrate, and scanning the transfer substrate with an absorbent that absorbs the liquid.

13. The method of claim 12, wherein the supplying of the liquid comprises at least one of a spraying method, a dispensing method, an inkjet dot method, or a method of flowing the liquid to the transfer substrate.

14. The method of claim 12, wherein the liquid includes at least one of water, ethanol, alcohol, polyol, ketone, halocarbon, acetone, flux, or an organic solvent.

15. The method of claim 12, wherein the absorbent includes fabric, tissue, polyester fiber, paper or a wiper.

\* \* \* \* \*